United States Patent
Chen et al.

(10) Patent No.: US 9,343,616 B2
(45) Date of Patent: May 17, 2016

(54) HETEROJUNCTION LIGHT EMITTING DIODE

(71) Applicant: GLOBALFOUNDRIES U.S. 2 LLC, Hopewell Junction, NY (US)

(72) Inventors: Tze-Chiang Chen, Yorktown Heights, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/711,462

(22) Filed: May 13, 2015

(65) Prior Publication Data

US 2015/0249188 A1     Sep. 3, 2015

Related U.S. Application Data

(60) Division of application No. 13/935,062, filed on Jul. 3, 2013, now Pat. No. 9,070,795, which is a continuation of application No. 13/905,840, filed on May 30, 2013, now Pat. No. 9,252,324.

(51) Int. Cl.
| | |
|---|---|
| *H01L 33/30* | (2010.01) |
| *H01L 33/00* | (2010.01) |
| *H01L 33/62* | (2010.01) |
| *H01L 33/18* | (2010.01) |
| *H01L 33/06* | (2010.01) |
| *H01L 21/02* | (2006.01) |

(52) U.S. Cl.
CPC ........ *H01L 33/0079* (2013.01); *H01L 33/0025* (2013.01); *H01L 33/06* (2013.01); *H01L 33/18* (2013.01); *H01L 33/305* (2013.01); *H01L 33/62* (2013.01); *H01L 21/02546* (2013.01); *H01L 2924/10329* (2013.01)

(58) Field of Classification Search
CPC ... H01L 33/305; H01L 33/18; H01L 33/0025; H01L 33/62
See application file for complete search history.

(56) References Cited

U.S. PATENT DOCUMENTS

| | | | |
|---|---|---|---|
| 3,353,114 A * | 11/1967 | Hanks | H01S 5/32 257/101 |
| 4,527,179 A | 7/1985 | Yamazaki | |

(Continued)

FOREIGN PATENT DOCUMENTS

| | | |
|---|---|---|
| EP | 1708275 A2 | 10/2006 |
| EP | 1708275 A3 | 5/2008 |

(Continued)

*Primary Examiner* — Ida M Soward
(74) *Attorney, Agent, or Firm* — Michael Le Strange; Hoffman Warnick LLC (57) ABSTRACT

A method for forming a light emitting device includes forming a monocrystalline III-V emissive layer on a monocrystalline substrate and forming a first doped layer on the emissive layer. A first contact is deposited on the first doped layer. The monocrystalline substrate is removed from the emissive layer by a mechanical process. A second doped layer is formed on the emissive layer on a side from which the substrate has been removed. The second doped layer has a dopant conductivity opposite that of the first doped layer. A second contact is deposited on the second doped layer.

9 Claims, 8 Drawing Sheets

(56) References Cited

U.S. PATENT DOCUMENTS

| | | | |
|---|---|---|---|
| 4,862,471 A | 8/1989 | Pankove | |
| 5,181,084 A | 1/1993 | Bommer et al. | |
| 5,285,078 A * | 2/1994 | Mimura | H01L 31/153 |
| | | | 257/103 |
| 5,387,804 A | 2/1995 | Suzuki et al. | |
| 5,393,993 A | 2/1995 | Edmond et al. | |
| 5,661,074 A | 8/1997 | Tischler | |
| 5,670,798 A | 9/1997 | Schetzina | |
| 5,686,734 A * | 11/1997 | Hamakawa | H01L 29/165 |
| | | | 257/16 |
| 5,689,123 A | 11/1997 | Major et al. | |
| 5,874,747 A | 2/1999 | Redwing et al. | |
| 6,100,546 A | 8/2000 | Major et al. | |
| 6,130,147 A | 10/2000 | Major et al. | |
| 6,342,405 B1 | 1/2002 | Major et al. | |
| 6,376,866 B1 | 4/2002 | Shakuda | |
| 6,465,809 B1 | 10/2002 | Furukawa et al. | |
| 6,888,750 B2 * | 5/2005 | Walker | H01L 21/822 |
| | | | 257/E21.606 |
| 6,949,433 B1 * | 9/2005 | Hidehiko | H01L 21/28282 |
| | | | 257/E21.21 |
| 7,091,523 B2 | 8/2006 | Cok et al. | |
| 7,531,840 B2 | 5/2009 | Edmond et al. | |
| 7,847,313 B2 | 12/2010 | Shibata | |
| 8,310,000 B2 * | 11/2012 | Takano | H01L 21/84 |
| | | | 257/315 |
| 8,993,370 B2 | 3/2015 | Munteanu et al. | |
| 2002/0033521 A1 | 3/2002 | Matsuoka | |
| 2002/0175340 A1 | 11/2002 | Shibata et al. | |
| 2003/0178629 A1 | 9/2003 | Yagi | |
| 2004/0026704 A1 | 2/2004 | Nikolaev et al. | |
| 2004/0031978 A1 | 2/2004 | D'Evelyn et al. | |
| 2004/0227203 A1 * | 11/2004 | Wu | H01L 27/1203 |
| | | | 257/474 |
| 2005/0133781 A1 | 6/2005 | Yan et al. | |
| 2005/0214965 A1 | 9/2005 | Park et al. | |
| 2006/0033111 A1 | 2/2006 | McClure et al. | |
| 2007/0194408 A1 | 8/2007 | Iwata et al. | |
| 2010/0012962 A1 | 1/2010 | Hong et al. | |
| 2012/0205683 A1 | 8/2012 | Beeson et al. | |
| 2013/0181308 A1 | 7/2013 | Arena et al. | |
| 2014/0169396 A1 | 6/2014 | Noma et al. | |

FOREIGN PATENT DOCUMENTS

| | | |
|---|---|---|
| EP | 1708275 B1 | 2/2013 |
| JP | 10084159 A | 3/1998 |
| JP | 11214749 A | 8/1999 |

* cited by examiner

HETEROJUNCTION LIGHT EMITTING DIODE

RELATED APPLICATION INFORMATION

This application is a divisional application of co-pending U.S. patent application Ser. No. 13/935,062 filed on Jul. 3, 2013, which is a continuation application of co-pending U.S. patent application Ser. No. 13/905,840 filed on May 30, 2013, incorporated herein by reference in its entirety.

BACKGROUND

1. Technical Field

The present invention relates to heterojunction devices and, more particularly, to an economic light emitting diode with reduced possibility for defects.

2. Description of the Related Art

Wide bandgap light emitting diodes (LEDs) (e.g., ultraviolet (UV), blue and particularly white) are of high interest for display and lighting applications. Wide bandgap materials are typically very expensive and also require high temperatures for epitaxial growth, which is the process needed to form these materials. This high expense is incompatible with low-cost and/or flexible substrates. Moreover, typical low-cost and/or flexible substrates do not withstand such high process temperatures.

Low-temperature alternatives include organic LEDs and a-SiC:H p-i-n LEDs. However, organic LEDs suffer from low lifetimes since the high exciton energies involved in this emission range result in chemical quenching. The a-SiC:H p-i-n LEDs suffer from excessive non-radiative recombination in the intrinsic a-SiC:H emissive layer due to the presence of a large density of defects inherent to amorphous materials.

SUMMARY

A method for forming a light emitting device includes forming a monocrystalline III-V emissive layer on a monocrystalline substrate; forming a first doped layer on the emissive layer; depositing a first contact on the first doped layer, removing the monocrystalline substrate from the emissive layer by a mechanical process; forming a second doped layer on the emissive layer on a side from which the substrate has been removed, the second doped layer having a dopant conductivity opposite that of the first doped layer; and depositing a second contact on the second doped layer.

A light emitting device includes a monocrystalline III-V emissive layer having a cleaved surface created by a spalling process. A first doped layer is formed on the cleaved surface of the emissive layer, and a first contact is formed on the first doped layer. A second doped layer is formed on the emissive layer on a side opposite that of the cleaved surface. A second contact is formed on the second doped layer.

Another light emitting device includes a monocrystalline III-V emissive layer, a first hot-carrier-tunneling injector (HTI) layer formed on a first side of the emissive layer, a first doped layer formed on the first HTI layer and a first contact formed on the first doped layer. A second HTI layer is formed on a second side of the emissive layer opposite the first side. A second doped layer is formed on the second HTI layer, and a second contact is formed on the second doped layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, a heterojunction light emitting diode LED device is provided that is comprised of a III-V emissive layer. In one embodiment, a thin GaN (or other wide bandgap III-V material) emissive layer is employed with a doped a-SiC:H based injection layer(s). The thin GaN emissive layer may be transferred from a host substrate onto a handle substrate using a layer transfer technique. This reduces the substrate cost significantly. The a-SiC:H injection layers are preferably grown by a low-temperature technique such as plasma enhanced chemical vapor deposition (PECVD) and eliminate the need for high-temperature epitaxial growth. Since the GaN layer is crystalline, non-radiative recombination in the emissive layer is substantially eliminated.

In accordance with the present principles, the conventional emissive layer (e.g., a-SiC:H) is replaced with c-GaN, of other III-V crystalline materials. This eliminates non-radiative recombination in the emissive layer, from which conventional devices suffer. Various III-N and other III-V materials are possible for use in the device. The properties of the a-SiC:H (bandgap, crystallinity, etc.) injection layers are widely tunable with PECVD growth conditions. The present embodiments may be employed for applications such as solid-state lighting, flexible displays, wearable electronics, etc.

It is to be understood that the present invention will be described in terms of a given illustrative architecture having substrates and layer stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a light emitting diode device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or LED devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of LED devices and/or integrated circuit chips with LED or other devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should also be understood that material compounds will be described in terms of listed elements, e.g., GaN or SiC. These compounds include different proportions of the elements within the compound, e.g., GaN includes $Ga_xN_{1-x}$, where x is less than or equal to 1, or SiC includes $Si_xC_{1-x}$ where x is less than or equal to 1, etc. In addition, other elements may be included in the compound, such as, e.g., AlGaN, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
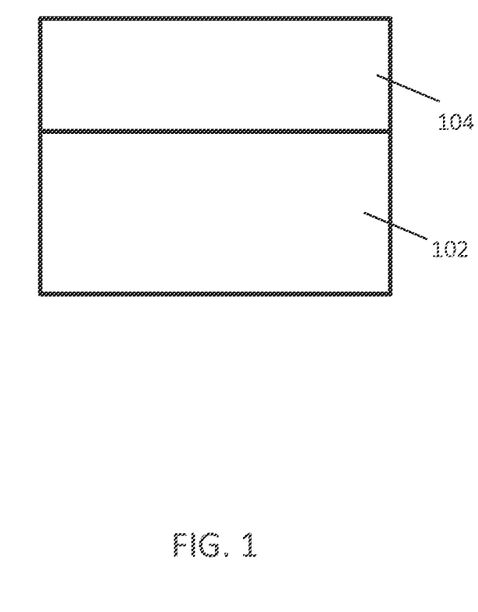
FIG. 1 is a cross-sectional view of a substrate having a monocrystalline III-V emissive layer formed thereon in accordance with the present principles.

Referring now to the drawings in which like numerals represent the same or similar elements and initially to FIG. 1, a cross-sectional view of a substrate 102 having an emissive layer 104 formed thereon is shown in accordance with one illustrative embodiment. The substrate 102 may include GaN, sapphire, Si, other III-V materials, etc. The substrate 102 is preferably a monocrystalline substrate to support the formation of a crystalline III-V layer for emissive layer 104 thereon. The III-V layer material of the emissive layer 104 preferably includes a III-N material and in particularly useful embodiments the III-V layer includes monocrystalline GaN (c-GaN). The emissive layer 104 may be formed by employing an epitaxial growth process. The emissive layer 104 may be comprised of the same material as or different material than that of the substrate 102. In some embodiments where the emissive layer 104 and the substrate 102 are comprised of the same material, the emissive layer 104 may be part of the substrate 102 rather than being formed on the substrate 102; for example, if the substrate 104 is comprised of c-GaN, and the emissive layer 104 is also comprised of c-GaN. The emissive layer 104 in its crystalline form provides a replacement for conventional emissive layers, which are typically amorphous hydrogenated SiC (a-SiC:H). The emissive layer 104 may include GaN for use with light emitting diode devices; however, other III-V materials may be employed as well. For example, III-N and III-P materials are of interest for blue, UV or white LEDs. However, any III-V material may be employed and the present embodiments are also applicable to blue, green, red, or any other color LED.

Figure 2:
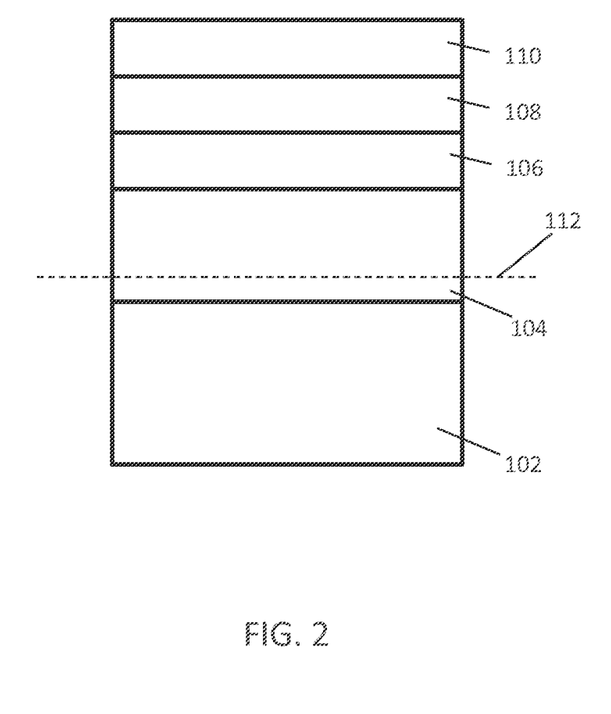
FIG. 2 is a cross-sectional view of the substrate of FIG. 1 having an HTI layer, a doped layer and a contact layer formed thereon in accordance with the present principles.

Referring to FIG. 2, a hot-carrier-tunneling injector (HTI) layer 106 is optionally formed on the emissive layer 104. The HTI layer 106 is preferably amorphous (e.g., a-Si:H or a-SiC:H) to provide a larger bandgap. The material of the HTI layer may include intrinsic or lightly doped material to provide higher resistivity. Alternatively, the HTI layer 106 may include thin insulating layers such as a-SiN$_x$:H, a-SiO$_x$:H, a-SiO$_x$N$_y$:H, etc. The HTI layer 106 is preferably formed using a low temperature process (e.g., below 400 degrees C.). It should be understood that the surface of the emissive layer 104 may be treated by standard cleaning and/or a hydrogen termination step (e.g. dipping in dilute hydrofluoric acid solution) prior to the deposition of the HTI layer, to improve the interface between the emissive layer and the HTI layer.

The HTI layer 106 including SiC:H may be grown using plasma-enhanced chemical vapor deposition (PECVD) at temperatures preferably less than 400° C. and more preferably in the range 150-250° C. However, other CVD techniques such as hot-wire CVD (HWCVD) may also be employed. The gases used for growing SiC:H layer may include silane, disilane, diclorosilane, etc. as a Si source, and methane, acetylene, propane, etc. as a C source, and may include hydrogen or deuterium as a carrier gas.

Other carrier gases such as argon, nitrogen and helium may be used as well.

If a-SiN$_x$:H, a-SiO$_x$:H or a-SiOxN$_y$:H are employed, these layers may be grown by radiofrequency (RF) PECVD, although direct current (DC) and very high frequency (VHF) PECVD processes may be employed as well. Other frequency ranges. e.g., kHz may also be used, as well as other CVD techniques. The a-SiN$_x$:H, a-SiO$_x$:H or a-SiO$_x$N$_y$:H may be grown from gases such as ammonia, nitrous oxide (N$_2$O) as an N source; silane, disilane, etc. as a Si source; carbon dioxide, oxygen, nitrous oxide, etc. as an oxygen source and may include a carrier gas such as hydrogen, deuterium, helium, argon, nitrogen, etc.

The HTI layer 106 may be intrinsic or lightly doped. Depending on the arrangement, the doping may be provided in-situ by phosphine, arsine, etc. for n-type and diborane, TMB (trimethylboron), etc. for p-type doping.

A doped layer 108 is formed on the HTI layer 106 if present or otherwise directly on the emissive layer 104. It should be understood that the surface of the HTI layer 106 (or the surface of the emissive layer 104 if the HTI layer 106 is not present) may be treated by standard cleaning and/or a hydrogen termination step (e.g. dipping in dilute hydrofluoric acid solution) prior to the deposition of the doped layer, to improve the interface between the HTI layer with and the doped layer or the interface between the emissive layer and the doped layer if the HTI layer is not present. However, if the HTI layer and the doped layer are formed in the same deposition tool (or different deposition tools/chambers connected to each other) without breaking the vacuum, surface treatment of the HTI layer prior to the deposition of the doped layer may not be necessary.

The doped layer 108 may include a SiC:H, although other materials may be employed. The doped layer 108 is preferably nano-crystalline (e.g., nc-SiC:H) or micro-crystalline (e.g., μc-SiC:H) to result in a higher activated doping and therefore better carrier injection. If SiC:H is employed for doped layer 108, similar processing may be performed as before for the HTI layer 106. For example, both DC and non-DC processes including standard RF (e.g., 13.56 MHz) or very high-frequency (VHF) PECVD can be employed. Preferably RF or DC plasma may be employed for a-SiC:H, and preferably RF or VHF are used for nc/pc-SiC:H with VHF being more preferred for nc/pc-SiC:H with a preferred frequency range of e.g., 60-120 MHz. Other frequency ranges, e.g., kHz may be employed as well. The doped layer 108 is preferably formed using a low temperature process (e.g., PECVD).

The gases used for growing SiC:H layers may include silane, disilane, dichlorosilane, etc. as a Si source; methane, acetylene, propane. etc. as a C source, and may include hydrogen or deuterium as a carrier gas. Other carrier gases such as argon, nitrogen and helium may be used as well. The doping of layer 108 may be provided in-situ by phosphine, arsine, etc. for n-type and diborane, TMB (trimethylboron), etc. for p-type doping. The SiC:H layers (for layers 106, 116, 108 and 118) may include N, O, F, Cl, D (deuterium). Ge, etc. or combinations thereof. In such cases, these species may be in the range of 1-10 atomic percent in concentration; however, higher or lower concentrations may be present.

A contact 110 is formed on the doped layer 108. The contact 110 may include a metal. e.g., Mo, Al, etc. In one embodiment, the contact 110 includes a transparent conductive material and may include a transparent conductive oxide (TCO), such as, e.g., indium-tin-oxide (ITO) or aluminum-doped zinc-oxide (ZnO:Al).

Next, the emissive layer 104 is prepared for a transfer process. In one embodiment, a cleave line 112 is identified to cleave or split off the substrate 102. The cleaving process includes a layer splitting by mechanical force (e.g., spalling, smart-cut, etc.). The cleaving or splitting process may include any other suitable wafer transfer process. In other embodiments, the substrate 102 may be polished or etched away from the emitter layer 104.

Figure 3:
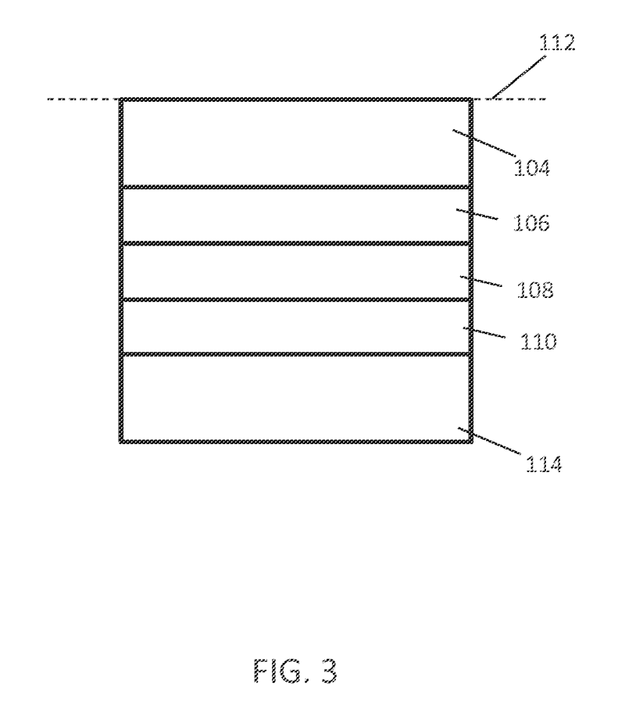
FIG. 3 is a cross-sectional view of the substrate of FIG. 2 having a handle substrate formed thereon after cleaving the emissive layer during a transfer process in accordance with the present principles.

Referring to FIG. 3, the cleave line 112 is indicated for reference as the stack of layers has been inverted for further processing. A handle substrate 114 has been adhered to the contact 110. The handle substrate 114 may have been added prior to the splitting process or may be added after the splitting process. The handle substrate 114 (or tape) may be adhered to contact 110. Handle substrate 114 may include any suitable material and may include a crystalline substrate, a ceramic or a flexible material. The handle or flexible substrate 114 may include a polymeric material(s), such as, e.g., thermoplastics, e.g., polyethylene terephthalate (PET), polyimide, etc.; reinforced epoxy resins, such as e.g., prepreg boards, etc.

Figure 4:
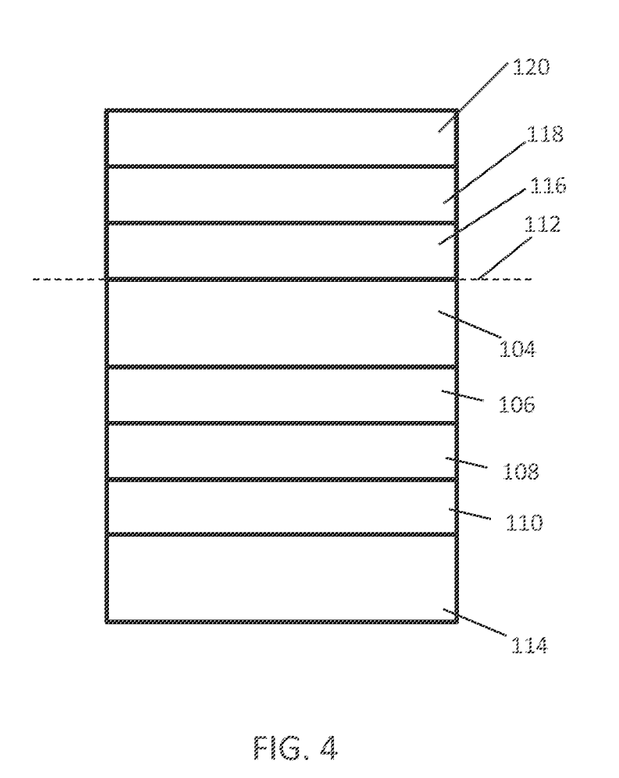
FIG. 4 is a cross-sectional view of the substrate of FIG. 3 having another HTI layer, doped layer and contact layer formed thereon in accordance with the present principles.

Referring to FIG. 4, another HTI layer 116 is optionally formed on the emitter layer 104. The HTI layer 116 is preferably amorphous (e.g., a-Si:H or a-SiC:H) to provide a larger bandgap. The material of the HTI layer may include intrinsic or lightly doped material to provide higher resistivity. Alternatively, the HTI layer 116 may include thin insulating layers such as a-SiN$_x$:H, a-SiO$_x$:H, a-SiO$_x$N$_y$:H, etc. The HTI layer 116 is preferably formed using a low temperature process (e.g., below 400 degrees C).

The HTI layer 116 including SiC:H may be grown using plasma-enhanced chemical vapor deposition (PECVD) at temperatures preferably less than 400° C. and more preferably in the range 150-250° C. However, other CVD techniques such as hot-wire CVD (HWCVD) may also be employed. The gases used for growing SiC:H layer may include silane, disilane, diclorosilane, etc. as a Si source, and methane, acetylene, propane, etc. as a C source, and may include hydrogen or deuterium as a carrier gas. Other carrier gases such as argon, nitrogen and helium may be used as well.

If a-SiN$_x$:H, a-SiO$_x$:H or a-SiO$_x$N$_y$:H are employed, these layers may be grown by RF PECVD, although DC and VHF PECVD processes may be employed as well. Other frequency ranges, e.g., kHz may also be used, as well as other CVD techniques. The a-SiN$_x$:H, a-SiO$_x$:H or a-SiO$_x$N$_y$:H may be grown from gases such as ammonia, nitrous oxide (N$_2$O) as an N source; silane, disilane, etc. as a Si source; carbon dioxide, oxygen, nitrous oxide, etc. as an oxygen source and may include a carrier gas such as hydrogen, deuterium, helium, argon, nitrogen, etc.

The HTI layer 116 may be intrinsic or lightly doped. Depending on the arrangement, the doping may be provided in-situ by phosphine, arsine, etc. for n-type and diborane, TMB (trimethylboron), etc. for p-type doping. If the HTI layer 116 is lightly doped it includes dopants having the opposite conductivity as HTI layer 106.

Another doped layer 118 is formed on the HTI layer 116 or the emissive layer 104 if the HTI layer 116 is not present. The doped layer 118 includes a dopant conductivity opposite that of the doped layer 108. The doped layer 118 may include a SiC:H, although other materials may be employed. The doped layer 118 is preferably nano-crystalline (e.g., nc-SiC:H) or micro-crystalline (e.g., μc-SiC:H) to result in a higher activated doping and therefore better carrier injection. If SiC:H is employed for doped layer 118, similar processing may be performed as before for the HTI layer 116. For example, both DC and non-DC processes including standard RF (e.g., 13.56 MHz) or very high-frequency (VHF) PECVD can be employed. Preferably RF or DC plasma is used for a-SiC:H, and preferably RF or VHF are used for nc/pc-SiC:H with VHF being more preferred for nc/μc-SiC:H with a preferred frequency range of e.g., 60-120 MHz. Other frequency ranges, e.g., kHz may be employed as well. The doped layer 108 is preferably formed using a low temperature process (e.g., PECVD).

The gases used for growing SiC:H layers may include silane, disilane, dichlorosilane, etc. as a Si source, methane, acetylene, propane, etc. as a C source, and may include hydrogen or deuterium as a carrier gas. Other carrier gases such as argon, nitrogen and helium may be used as well. The doping of layer 118 may be provided in-situ by phosphine, arsine, etc. for n-type and diborane, TMB (trimethylboron), etc. for p-type doping. The SiC:H layers (for layers 106, 116, 108 and 118) may include N, O, F, Cl, D (deuterium), Ge, etc. or combinations thereof. In such cases, these species may be in the range of 1-10 atomic percent in concentration; however, higher or lower concentrations may be present.

Another contact 120 is formed on the doped layer 118. The contact 120 may include a metal, e.g., Mo, Al, etc. In one embodiment, the contact 120 includes a transparent conductive material and may include a transparent conductive oxide (TCO), such as, e.g., indium-tin-oxide (ITO) or aluminum-doped zinc-oxide (ZnO:Al).

The handle substrate 114 may or may not be removed. A light emitting diode device is now provided as shown in FIG. 4. However, other devices may also be formed using the same or similar structure and processing techniques. Such structures may include solid-state lighting, flexible displays, wearable electronics, etc. By employing a pristine crystalline emissive layer (e.g., GaN), non-radiative recombination in the emissive layer is virtually eliminated. Various III-N and III-V materials are possible for the emissive layer, and the wafer transfer processing ensures low cost processing. In addition, the present principles may employ a-SiC:H injection layers (106, 116). The composition and processing of the HTI layers 106 and 116 provides widely tunable properties with PECVD growth conditions (e.g., tunable properties can include bandgap, crystallinity, etc.).

Figure 5:
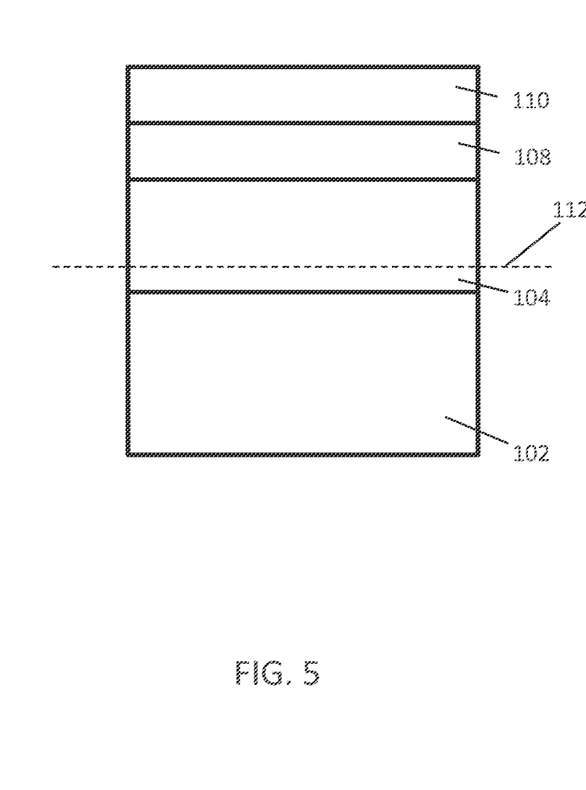
FIG. 5 is a cross-sectional view of the substrate of FIG. 1 having a doped layer and a contact layer formed thereon in accordance with the present principles.

Referring to FIG. 5, a cross-sectional view of substrate 102 having an emissive layer 104 formed thereon is shown in accordance with another illustrative embodiment. The substrate 102 may include GaN, sapphire, Si, other III-V materials, etc. The substrate 102 is preferably a monocrystalline substrate to support the formation of a crystalline III-V layer for emissive layer 104 thereon. The III-V layer material of the emissive layer 104 preferably includes a III-N material and in particularly useful embodiments the III-V layer includes monocrystalline GaN (c-GaN). The emissive layer 104 may be formed by employing an epitaxial growth process. The emissive layer 104 may be comprised of the same material as or different material than that of the substrate 102.

In some embodiments where the emissive layer 104 and the substrate 102 are comprised of the same material, the emissive layer 104 may be part of the substrate 102 rather than being formed on the substrate 102; for example, if the substrate 104 is comprised of c-GaN, and the emissive layer 104 is also comprised of c-GaN. The emissive layer 104 in its crystalline form provides a replacement for conventional emissive layers, which are typically amorphous hydrogenated SiC (a-SiC:H). The emissive layer 104 may include GaN for use with light emitting diode devices; however, other III-V materials may be employed as well. For example, III-N and III-P materials are of interest for blue, UV or white LEDs. However, any III-V material may be employed and the present embodiments are also applicable to blue, green, red, or any other color LED.

The doped layer 108 is formed directly on the emissive layer 104. The doped layer 108 may include SiC:H, although other materials may be employed. The doped layer 108 is preferably nano-crystalline (e.g., nc-SiC:H) or micro-crystalline (e.g., μc-SiC:H) to result in a higher activated doping and therefore better carrier injection. If SiC:H is employed for doped layer 108, both DC and non-DC processes including standard RF (e.g., 13.56 MHz) or very high-frequency (VHF) PECVD can be employed for formation. The doped layer 108 is preferably formed using a low temperature process (e.g., PECVD).

A contact 110 is formed on the doped layer 108. The contact 110 may include a metal, e.g., Mo, Al, etc. In one embodiment, the contact 110 includes a transparent conductive material and may include a transparent conductive oxide (TCO), such as, e.g., indium-tin-oxide (ITO) or aluminum-doped zinc-oxide (ZnO:Al).

Next, the emissive layer 104 is prepared for a transfer process. In one embodiment, a cleave line 112 is identified to cleave or split off the substrate 102. The cleaving process includes a layer splitting by mechanical force (e.g., spalling, smart-cut, etc.). The cleaving or splitting process may include any other suitable wafer transfer process. In other embodiments, the substrate 102 may be polished or etched away from the emitter layer 104.

Figure 6:
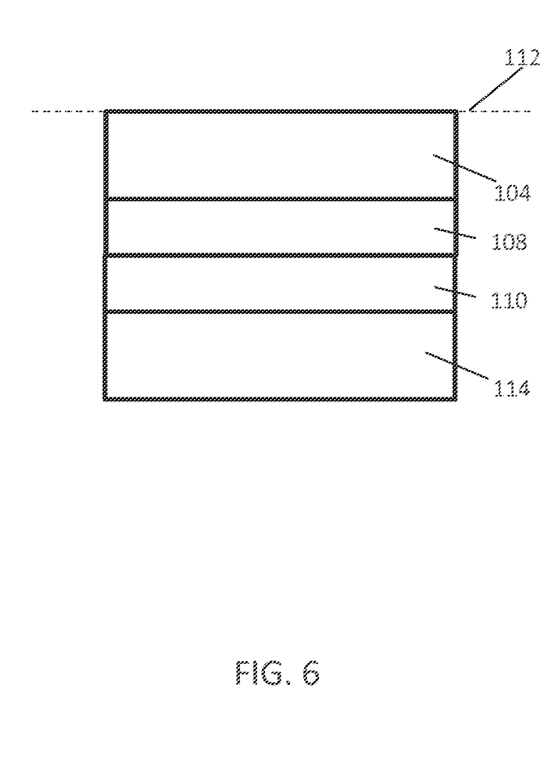
FIG. 6 is a cross-sectional view of the substrate of FIG. 5 having a handle substrate formed thereon after cleaving the emissive layer during a transfer process in accordance with the present principles.

Referring to FIG. 6, the cleave line 112 is indicated for reference as the stack of layers has been inverted for further processing. A handle substrate 114 has been adhered to the contact 110. The handle substrate 114 may have been added prior to the splitting process or may be added after the splitting process. The handle substrate 114 (or tape) may be adhered to contact 110. Handle substrate 114 may include any suitable material and may include a crystalline substrate, a ceramic or a flexible material. The handle or flexible substrate 114 may include a polymeric material(s), such as, e.g., thermoplastics, e.g., polyethylene terephthalate (PET), polyimide, etc.; reinforced epoxy resins, such as e.g., prepreg boards, etc.

Figure 7:
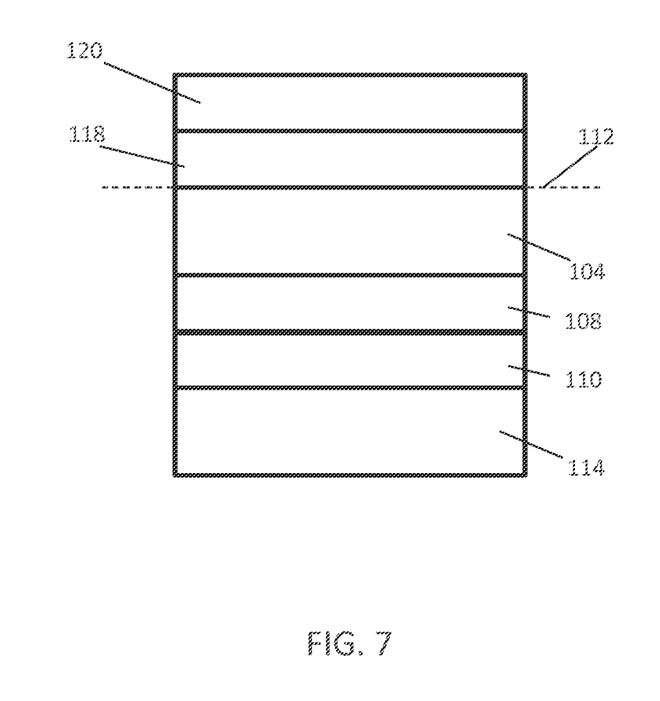
FIG. 7 is a cross-sectional view of the substrate of FIG. 6 having another doped layer and contact layer formed thereon in accordance with the present principles.

Referring to FIG. 7, another doped layer 118 is formed on the emissive layer 104. The doped layer 118 includes a dopant conductivity opposite that of the doped layer 108. The doped layer 118 may include a SiC:H, although other material may be employed. The doped layer 118 is preferably nano-crystalline (e.g., nc-SiC:H) or micro-crystalline (e.g., μc-SiC:H) to result in a higher activated doping and therefore better carrier injection. If SiC:H is employed for doped layer 118, both DC and non-DC processes including standard RF (e.g., 13.56 MHz) or very high-frequency (VHF) PECVD can be employed. The doped layer 108 is preferably formed using a low temperature process (e.g., PECVD).

Another contact 120 is formed on the doped layer 118. The contact 120 may include a metal, e.g., Mo, Al, etc. In one embodiment, the contact 120 includes a transparent conductive material and may include a transparent conductive oxide (TCO), such as, e.g., indium-tin-oxide (ITO) or aluminum-doped zinc-oxide (ZnO:Al). The handle substrate 114 may or may not be removed. A light emitting diode device is now provided as shown in FIG. 7. However, other devices may also be formed using the same or similar structure and processing techniques. Such structures may include solid-state lighting, flexible displays, wearable electronics, etc. By employing a pristine crystalline emissive layer (e.g., GaN) non-radiative recombination in the emissive layer is virtually eliminated. Various III-N and III-V materials are possible for the emissive layer 104, and the wafer transfer processing ensures low cost processing. It should be understood that the device may include one HTI layer (106 or 116), two HTI layers or no HTI layers. The handle substrate 114 may be removed, as needed.

FIGS. 8-11 show different illustrative configurations for heterojunction-LEDs bonded to thin film transistor (TFT) active-matrix backplanes. The backplanes may be flexible or rigid. Other structures and features are also contemplated.

Figure 8:
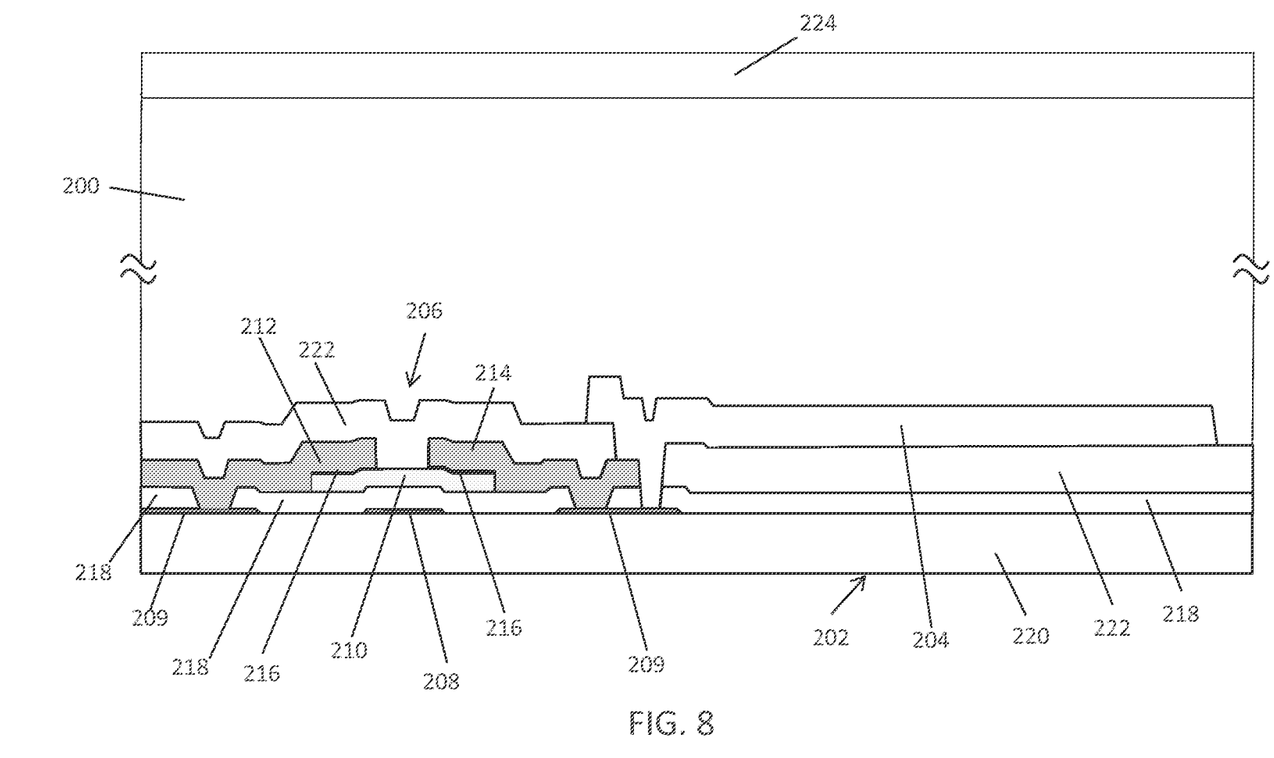
FIG. 8 is a cross-sectional view of a flexible heterojunction-LED (HJ-LED) mounted or bonded (blanketed) to an active-matrix backplane in accordance with the present principles.

Referring to FIG. 8, a flexible heterojunction-LED (HJ-LED) 200 is bonded to a TFT active-matrix backplane 202. The HJ-LED 200 is bonded to the active-matrix backplane, e.g. by metal-to-metal bonding, etc. using the contact layers to TCO/metal portions 204 in the structure. The handle substrate (114) may be removed for top-emission or double-sided display devices. Lateral conduction of the LED 200 is negligible; therefore, no patterning is necessary for single-color or white LED plus color filter applications.

A driver TFT 206 is formed on a substrate 220 includes a gate conductor 208 and conductive pads or lines 209 thereon. A semiconducting island 210 (channel), which conducts across a source/drain metal 212 and a source/drain metal 214, is formed over the gate conductor 208. The source metal 212 and drain metal 214 are formed over highly doped or conductive regions 216 on the island 210. A gate dielectric 218 (e.g., a nitride) is disposed between the island 210 and the gate conductor 208. A passivation layer 222 is formed over the TFT 206 and supports TCO/metal 204. A second contact layer 224 is formed on the HJ-LED 200 or is bonded to the contact layer (e.g., 110 or 120) of the device 200. It should be understood that the backplane may include additional TFTs or other components not illustrated in this example. At least one additional TFT is used for row selection, and at least one capacitor is used for charge storage, as is known in the art. In one embodiment, the substrate 220 and the HJ-LED 200 are flexible (as well as other structures) to permit bending or rolling of the entire structure.

Figure 9:
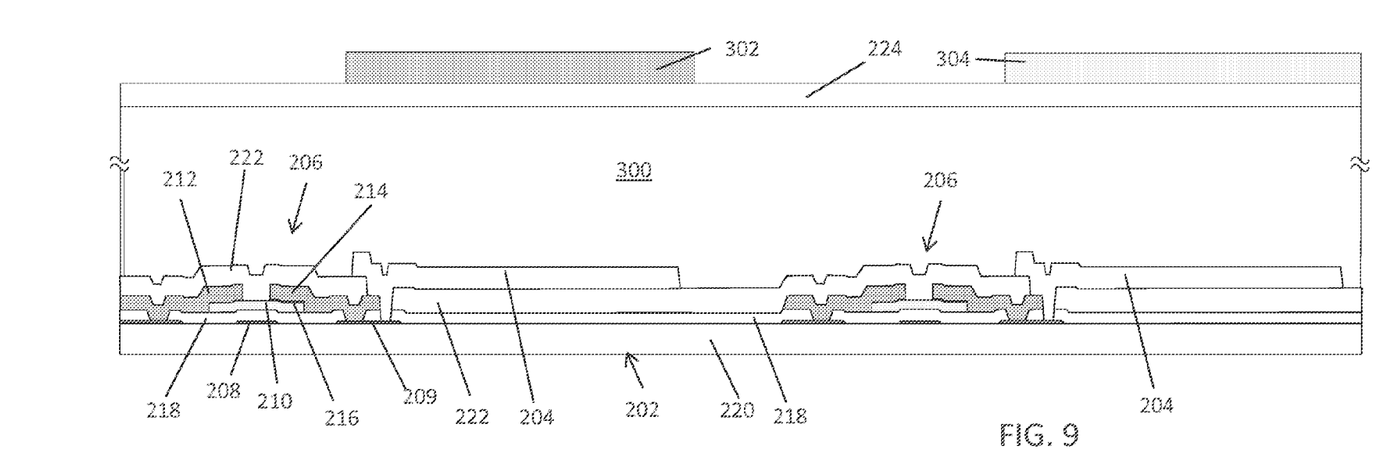
FIG. 9 is a cross-sectional view of a flexible white heterojunction-LED (HJ-LED) mounted or bonded to an active-matrix backplane and employing color filters for a top emission device in accordance with the present principles.

Referring to FIG. 9, another HJ-LED 300 is bonded to the TFT active-matrix backplane 202 and configured for top emission (through color filters 302, 304). In this embodiment, the HJ-LED 300 includes a white LED and includes color filters 302 and 304. Though only two color filters are depicted, the color filters preferably include red, green and blue (RGB) filters. The LED 300 is blanket deposited or formed over the TFTs 206. The active regions of the LEDs 300 will depend upon the structures below (e.g., TCO/metal 204) for emitting light. As before, no patterning of the LED 300 is needed due to negligible lateral conduction of the LED 300. In some embodiments, a conversion layer may be used to convert the light emitted from the LED, as known in the art. In one example, a conversion layer comprised of a phosphorescent material may be used to convert the emitted light from ultra-violet (UV) to white. A conversion layer may be used instead or in addition to the color filter. For example, a red color filter on top of a phosphorescent material may be used to convert the emitted UV light to white (through phosphorescent conversion) and then to red (through color filtering).

Figure 10:
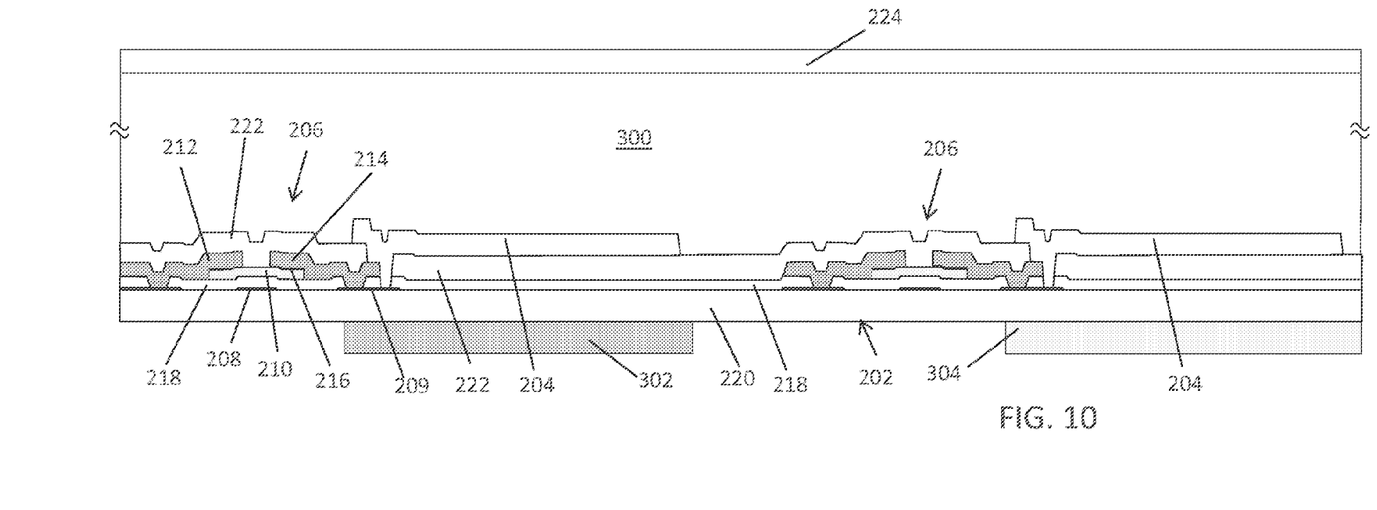
FIG. 10 is a cross-sectional view of a flexible white heterojunction-LED (HJ-LED) mounted or bonded to an active-matrix backplane and employing color filters for a bottom emission device in accordance with the present principles.

Referring to FIG. 10, another HJ-LED 300 is bonded to the TFT active-matrix backplane 202 and configured for bottom emission (through color filters 302, 304). Also in this embodiment, the W-LED 300 includes a white LED and includes color filters 302 and 304. Though only two color filters are depicted, the color filters preferably include red, green and blue (RGB) filters. The LED 300 is blanket deposited or formed over the TFTs 206. The active regions of the LEDs 300 will depend upon the structures below (e.g., TCO/metal 204) for emitting light. As before, no patterning of the LED 300 is needed due to negligible lateral conduction of the LED 300. It should be understood that the color filters (and conversion layers if present) may be applied to both the top and bottom such that both bottom emission and top emission are provided in a same structure.

Figure 11:
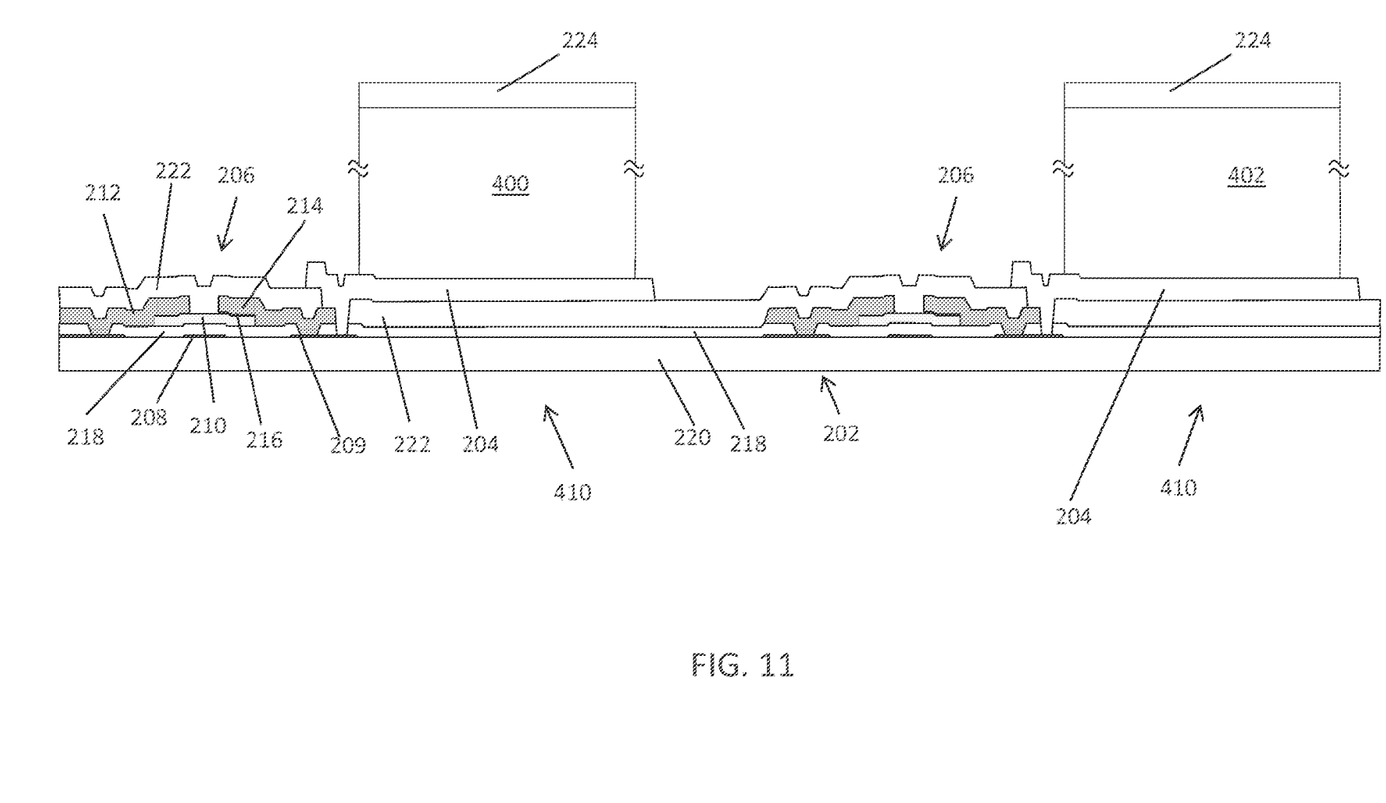
FIG. 11 is a cross-sectional view of colored HJ-LEDs mounted or bonded to an active-matrix backplane to form subpixels without employing color filters in accordance with the present principles.

Referring to FIG. 11, HJ-LEDs 400, 402 are formed over the TCO/metal layers 204 of the TFT active-matrix backplane 202 to form RGB or RGB White (RGBW) LEDs without the need for color filters. In this embodiment, different LED materials may be employed for each subpixel 410. The LEDs 400, 402 individually emit the appropriate subpixel color (e.g., R, G, B subpixels or R, G, B, W subpixels). Although the LEDs 400, 402 and associated layers 224 need to be patterned, efficiency is gained by eliminating the need for color filters (energy efficient). The LED 400, 402 may be bonded to the pads 204 or may be blanket deposited followed by a patterning process. The device may be top emission, bottom emission or double-sided (bifacial).

Figure 12:
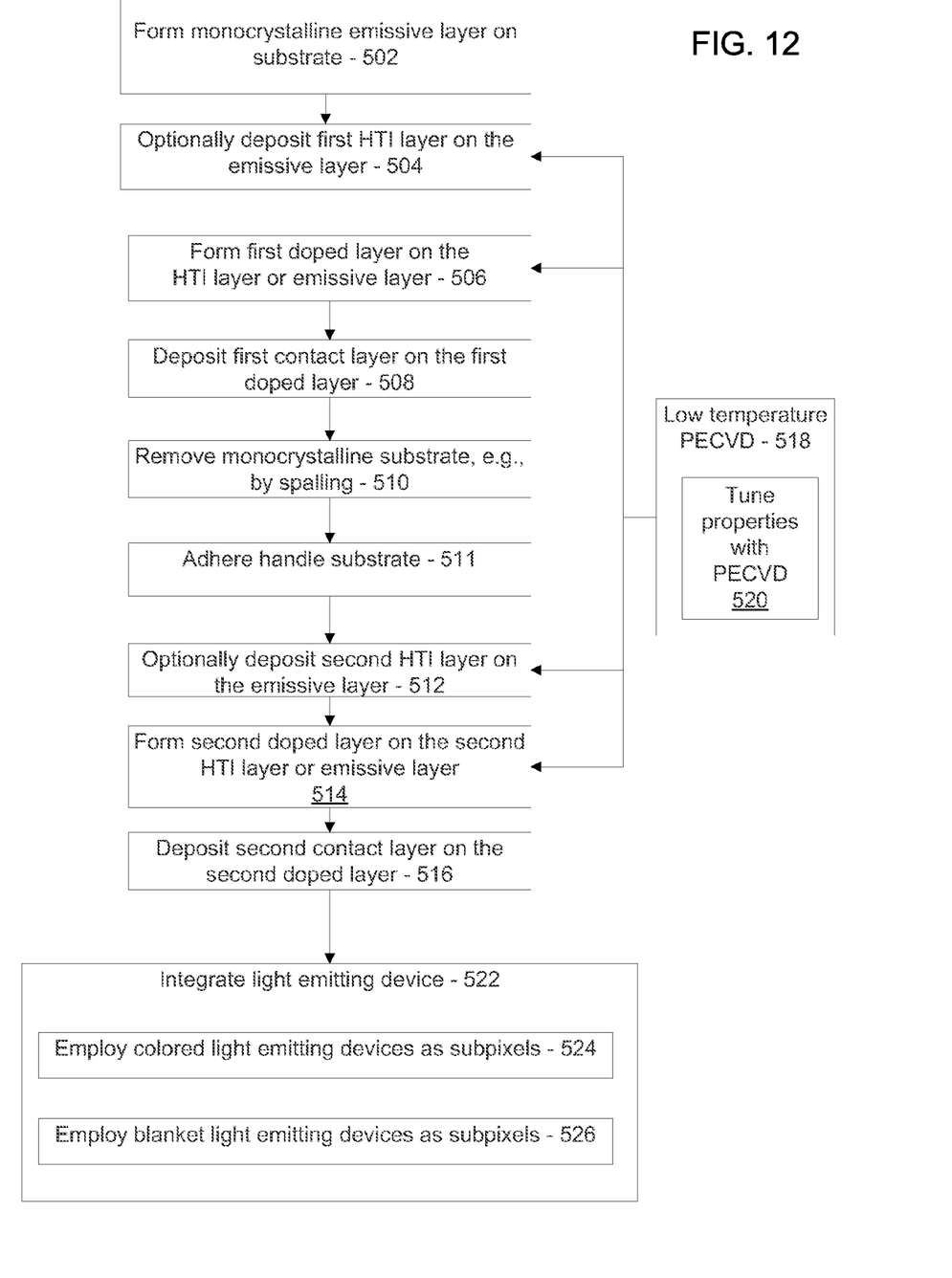
FIG. 12 is a block/flow diagram showing a method for forming a light emitting device in accordance with illustrative embodiments.

Referring to FIG. 12, a block diagram depicts a method for forming a light emitting device in accordance with the present principles. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 502, a monocrystalline III-V emissive layer is formed on a monocrystalline substrate. The monocrystalline III-V emissive layer may include a monocrystalline III-N emissive layer such as a GaN emissive layer.

In block 504, a first hot-carrier-tunneling injector (HTI) layer is optionally deposited on a first side of the emissive layer. The first HTI layer may include amorphous hydrogenated SiC, e.g., either intrinsic or lightly doped, or one or more of amorphous hydrogenated silicon nitride, amorphous hydrogenated silicon oxide, and amorphous hydrogenated silicon oxynitride. In block 506, a first doped layer is formed on the first HTI layer or directly on the emissive layer. In block 508, a first contact is deposited on the first doped layer.

In block 510, the monocrystalline substrate is removed from the emissive layer. This may include spalling the emissive layer to remove the substrate. Other embodiments may include etching or polishing the substrate away.

In block 511, a handle substrate may be adhered to the first contact layer (before or after the substrate removal). The handle substrate is provided to permit transfer of the partially fabricated device.

In block 512, a second HTI layer may optionally be deposited on a second side of the emissive layer from which the substrate has been removed. The second HTI layer may include amorphous hydrogenated SiC, e.g., either intrinsic or lightly doped, or one or more of amorphous hydrogenated silicon nitride, amorphous hydrogenated silicon oxide, and amorphous hydrogenated silicon oxynitride. It should be noted that embodiments may include one HTI layer, two HTI layers or no HTI layers.

In block 514, a second doped layer is formed on the second HTI layer or directly on the emissive layer and includes a dopant conductivity opposite that of the first doped layer. In block 516, a second contact is deposited on the second doped layer. In some embodiments, although advantageous, the HTI layers may be omitted.

In block 518, PECVD is employed to form one or more of the first HTI, the first doped layer, the second HTI layer and the second doped layer. The process preferably includes temperatures less than about 400 degrees C.

In block 520, amorphous HTI layers may have their properties tuned during the plasma enhanced chemical vapor deposition process. The properties may include dopant concentration, crystallinity, bandgap, etc.

In some embodiments, the light emitting device is employed as an LED or for other light emitting application. In other embodiments, the light emitting device may be incorporated into other structures. In block 522, the light emitting device may be mounted or integrated into a display backplane to form a subpixel or to mount an LED on a circuit board or chip. In block 524, a plurality of light emitting devices emit different colors such that the plurality of light emitting devices are employed as different colored subpixels in the display backplane. In block 526, the light emitting device may be blanketed over a plurality of pixel devices (e.g., TFTs) on the display backplane. Light is emitted from the light emitting devices at positions corresponding to the plurality of pixel devices. The light emitting device may be mounted on other platforms and may include other configurations.

Having described preferred embodiments for a heterojunction light emitting diode (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A light emitting device, comprising:
   a monocrystalline III-V emissive layer;
   a first hot-carrier-tunneling injector (HTI) layer formed on a first side of the emissive layer;
   a first doped layer formed on the first HTI layer;
   a first contact formed on the first doped layer;
   a second HTI layer formed on a second side of the emissive layer opposite the first side;
   a second doped layer formed on the second HTI layer; and
   a second contact formed on the second doped layer.

2. The device as recited in claim 1, wherein the device is mounted to a display backplane to form a subpixel.

3. The device as recited in claim 1, wherein the monocrystalline III-V emissive layer includes a monocrystalline III-N emissive layer.

4. The device as recited in claim 1, wherein the at least one of the first and second HTI layers include one of amorphous hydrogenated SiC, amorphous hydrogenated silicon nitride, amorphous hydrogenated silicon oxide, and amorphous hydrogenated silicon oxynitride.

5. The device as recited in claim 1, wherein at least one of the first and second HTI layer comprises a-Si:H or a-SiC:H.

6. The device as recited in claim 1, wherein at least one of the first and second HTI layer is intrinsic or lightly doped material.

7. The device as recited in claim 1, wherein at least one of the first and second first HTI layer 106 further comprises insulating layers of a-SiN$_x$:H, a-SiO$_x$:H, a-SiO$_x$N$_y$:H, and combinations thereof.

8. The device as recited in claim 1, wherein at least one of the first and second doped layer is comprised of a-SiC:H, nc-SiC:H, μc-SiC:H or a combination thereof.

9. The device as recited in claim 1, wherein at least one of the first and second contact comprise Mo, Al, TCO, indium-tin-oxide (ITO), aluminum-doped zinc-oxide (ZnO:Al) or a combination thereof.

* * * * *